(12) United States Patent
Maschke

(10) Patent No.: US 7,538,671 B2
(45) Date of Patent: May 26, 2009

(54) MEDICAL SYSTEM HAVING A MAGNETIC FIELD WITH A HIGH MAGNETIC FIELD INTENSITY

(75) Inventor: Michael Maschke, Lonnerstadt (DE)

(73) Assignee: Siemens Aktiengesellschaft, Munich (DE)

( * ) Notice: Subject to any disclaimer, the term of this patent is extended or adjusted under 35 U.S.C. 154(b) by 658 days.

(21) Appl. No.: 11/101,622

(22) Filed: Apr. 7, 2005

(65) Prior Publication Data
US 2005/0225327 A1 Oct. 13, 2005

(30) Foreign Application Priority Data
Apr. 7, 2004 (DE) .................... 10 2004 017 185

(51) Int. Cl.
*G08B 13/00* (2006.01)
(52) U.S. Cl. .................... 340/541; 340/572.1; 340/555
(58) Field of Classification Search .............. 340/541, 340/5.2, 5.21, 5.8, 5.81, 573.1, 539.12, 572.1, 340/555, 547; 128/903; 600/300–301
See application file for complete search history.

(56) References Cited

U.S. PATENT DOCUMENTS

| | | | | |
|---|---|---|---|---|
| 4,468,657 A | * | 8/1984 | Rossin | 340/555 |
| 4,530,007 A | * | 7/1985 | Schmidt | 378/98.2 |
| 4,779,048 A | * | 10/1988 | Aichele | 340/547 |
| 4,864,282 A | * | 9/1989 | Toeg | 340/541 |
| 4,954,812 A | | 9/1990 | Lebron | |
| 4,991,193 A | * | 2/1991 | Cecil et al. | 378/117 |
| 5,253,647 A | | 10/1993 | Takahashi et al. | |
| 5,325,084 A | * | 6/1994 | Timm et al. | 340/541 |
| 5,537,452 A | * | 7/1996 | Shepherd et al. | 378/65 |
| 5,655,533 A | | 8/1997 | Petropoulos et al. | |
| 5,682,142 A | * | 10/1997 | Loosmore et al. | 340/572.1 |
| 5,793,290 A | | 8/1998 | Eagleson et al. | |
| 5,880,954 A | * | 3/1999 | Thomson et al. | 340/541 |
| 5,969,608 A | * | 10/1999 | Sojdehei et al. | 340/541 |
| 6,356,780 B1 | * | 3/2002 | Licato et al. | 600/407 |
| 6,630,879 B1 | | 10/2003 | Creighton, IV et al. | |
| 6,720,874 B2 | * | 4/2004 | Fufido et al. | 340/541 |
| 6,772,001 B2 | | 8/2004 | Maschke | |
| 6,825,663 B2 | | 11/2004 | Bechtold et al. | |
| 6,853,179 B2 | | 2/2005 | Buchhold | |
| 7,038,588 B2 | * | 5/2006 | Boone et al. | 600/300 |
| 7,106,193 B2 | * | 9/2006 | Kovach | 340/541 |
| 7,120,488 B2 | * | 10/2006 | Nova et al. | 128/903 |
| 2003/0171669 A1 | | 9/2003 | Kopp | |

FOREIGN PATENT DOCUMENTS

| | | |
|---|---|---|
| DE | 34 40 281 A1 | 5/1985 |
| DE | 692 04 256 T2 | 8/1995 |
| DE | 196 26 596 C2 | 1/1997 |
| DE | 196 25 409 A1 | 1/1998 |

(Continued)

*Primary Examiner*—John A Tweel, Jr.

(57) ABSTRACT

To increase safety in the event of access to a total system 1; 32 in particular a medical system, with a field 3.1; 33.1 of high magnetic field intensity, a subsystem 5-12; 22-26, in particular with a light barrier 6 and/or a metal detector 5 and/or a door contact 25, is provided as the means for detecting access. According to one embodiment of the invention, the field line pattern and/or the intensity of the magnetic field is graphically represented by means of a luminescent display field 24 located on the floor, in particular made of photodiodes 31.

18 Claims, 4 Drawing Sheets

| | FOREIGN PATENT DOCUMENTS | | |
|---|---|---|---|
| DE | 198 09 076 A1 | 9/1999 | |
| DE | 101 04 453 A1 | 8/2002 | |
| DE | 101 64 716 C2 | 11/2002 | |
| DE | 102 03 372 A1 | 4/2003 | |
| DE | 102 06 901 A1 | 9/2003 | |
| EP | 1 174 724 A2 | 1/2002 | |
| EP | 1 340 994 A1 | 9/2003 | |
| GB | 2 303 261 A | 2/1997 | |
| JP | 2002219118 A | * | 8/2002 |
| JP | 2003265436 A | 9/2003 | |
| WO | WO 00/51514 | 9/2000 | |

\* cited by examiner

MEDICAL SYSTEM HAVING A MAGNETIC FIELD WITH A HIGH MAGNETIC FIELD INTENSITY

CROSS REFERENCE TO RELATED APPLICATIONS

This application claims priority to the German application No. 10 2004 017 185.8, filed Apr. 7, 2004 which is incorporated by reference herein in its entirety.

FIELD OF INVENTION

The invention relates to a total system, in particular a medical system with a field of high, variable magnetic field intensity.

BACKGROUND OF INVENTION

In medical technology, systems based on nuclear spin resonance are used for image generation, like for example magnetic resonance systems (MR) or devices for the magnetic navigation (MN) of probes within the body. Systems of this type known for example from the previously mentioned DE 102 03 372 A1 require fields, some of a variable nature, with extremely high field intensities of up to 0.1 Tesla for MN systems and 3 Tesla for MR systems.

Strong magnetic fields can result in unwanted damage and disturbance to electronic devices, including medical devices as well as clocks and magnetic cards.

There are also known cases in which patients in an area of high field intensity for examination purposes are injured or killed by metal objects accelerating towards them. Personal injury can also result, when people with metal implants are located in the area of the magnetic fields. An injury to the myocardium can occur particularly in patients with pacemakers due to the pacemaker electrodes heating up as a result of induction or heart pacemakers can fail as a result of faults at the pulse generator.

To reduce this risk or prevent it completely, warning signs have hitherto been used in the access area of the systems mentioned based on nuclear spin resonance and the critical area of the field lines has been marked on the floor of the examination room using colored adhesive tape. Notification of this type is nevertheless frequently overlooked or unintentionally disregarded. Furthermore, medical personal also often forget to look out for implants, or incorrect information is given unwittingly on the part of the patient.

DE 196 26 596 C2 discloses a circuit for protecting a transportable electronic system from a magnetic field with high level, which is connected to the electronic system and comprises a measuring unit for field detection and several warning devices.

SUMMARY OF THE INVENTION

It is therefore an object of the invention to increase safety in a simple manner in the event of access to fields of high magnetic field intensity.

This object is achieved by the claims.

The total system according to the invention enables personal access to the areas of high and variable magnetic field intensity to be detected by means of the subsystem, and thus enables users, patients and/or approaching persons to be sensitized in order, if necessary, to take further steps to avoid damage.

According to one embodiment of the invention, provision is made for access to be blocked into the area of the magnetic field in the case of access detection. In this way, entry into the danger area is prevented and danger to persons is essentially ruled out. Furthermore an operating block on at least one part of the total system is effectively provided particularly in the case of positive metal detection, whereby it is particularly advantageous to block the part of the total system which serves to generate variable magnetic fields. This reduces the danger to persons as a result of metal objects or metal implants.

An expedient embodiment for simple operation provides for the use of an additional operating element, by means of which the access block and/or the operating block can be lifted for at least one part of the total system after previous acknowledgement of access detection by the user. This avoids delays in the operation of the total system due to complex unlocking procedures.

A further embodiment of the invention provides that in the case of access detection, a signal is generated, in particular an acoustic or optical signal, to alert the user or the approaching person to danger. The provision of a means for generating an acoustic signal in the form of a voice message is expedient.

BRIEF DESCRIPTION OF THE DRAWINGS

The invention and further advantageous embodiments according to features of the subclaims are explained in more detail below with reference to schematic exemplary embodiments in the drawing, in which:

DETAILED DESCRIPTION OF INVENTION

Figure 1:
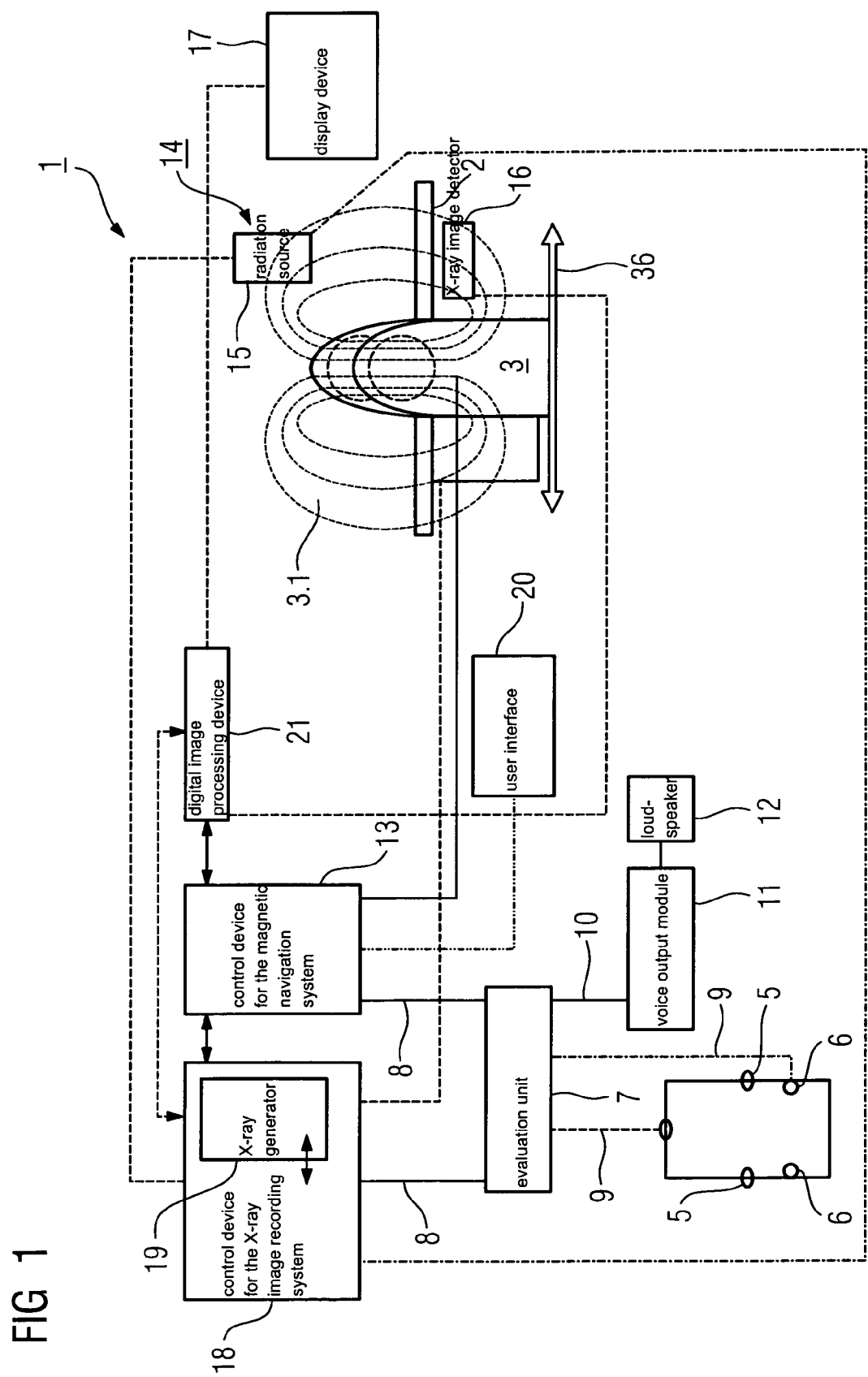
FIG. 1 shows a medical system for magnetic navigation with an associated magnetic field of high field intensity and a subsystem for detecting access to said magnetic field.

FIG. 1 shows a total medical system 1, by means of which a patient located on a patient table 2 can be examined/treated. The total system 1 described here is a device for magnetic navigation, the essential components of which are a device 3 generating a magnetic field, a control device 13 for the magnetic navigation system and an X-ray image recording system 14.

The device 3 generating the magnetic field can be arranged in a movable fashion, for example so that it can be transported on runners 36. The device 3 generating a magnetic field establishes an external magnetic field 3.1 of high field intensity in relation to the patient, by means of which the permanent or variable magnetic field of an object (not shown in further detail), a catheter for example, interacts within the body of the patient. By changing one or both magnetic fields, or by changing the position of the magnetic fields, the object in the body of the patient can be controlled by means of the control device 13 for the magnetic navigation system. A similar total system is known for example from U.S. Pat. No. 6 630 879 B1.

The X-ray image recording system 14 serves to monitor the movements of the object in the body of the patient. The X-ray image recording system 14 comprises a radiation source 15 for generating X-rays, an X-ray image detector 16 for recording the X-ray images, a control device for the X-ray system 18 and an X-ray generator 19. The radiation source 15 and the X-ray detector 16 can be arranged in a movable C-arm construction (not shown here), described for example in DE 196 25 409 A1.

The image signals recorded by the X-ray image detector 16 and routed to the control device 18 for the X-ray system are processed in a digital image processing device 21 and can be output on a display 17. The control device 13 for the magnetic navigation and the control device 18 for the X-ray image recording system can communicate alternately with one another and with the image processing device 21, in order to avoid collisions of the system components for example. A similar total system 1 is known from DE 102 03 372 A1.

According to the invention, the total system 1 according to FIG. 1 has a subsystem 5-12 for access detection. Particularly according to a first embodiment the subsystem 5-12 contains a light barrier 6 as the means for detecting access and according to a further embodiment a metal detector 5 as the means for detecting the access, both being located in the entry area of the total system 1. An ultrasound room monitoring system or pressure sensors can also be provided as means for detecting the access.

Both the light barrier 6 and the metal detector 5 are connected by means of a communication line 9 to an evaluation unit 7. This in turn has communication lines 8 to the control device 18 for the X-ray system and to the control device 13 for the magnetic navigation. The communication lines 8 enable a simple operating block on at least one part of the total system 1, in the case of access detection, in particular when the metal detector is activated.

In a further embodiment an access block in the case of access detection is advantageous, but not explicitly shown in the exemplary embodiment illustrated. According to a further embodiment, in order to facilitate operation of the total system 1, an additional operating element (not shown in the drawing), in particular a user I/O, by means of which the access block or the block on at least one part of the total system 1 can be lifted after previous acknowledgment of access detection, can be integrated in a user interface 20.

For additional protection of persons, of the field of high magnetic field intensity 3.1 can be powered down if there is no acknowledgement of access detection. In the case of an electromagnet as the device 3 generating the magnetic field, a direct power-down is conceivable, whilst in the case of a super-conducting magnet, controlled discharge of the stored field energy (quench) can be provided for.

Furthermore, a means for generating a particularly acoustic and/or optical signal is advantageously provided in the case of access detection. In one embodiment of the invention, a means is hereby used for generating an acoustic signal in the form of a voice message. A voice output module 11 and a loudspeaker 12 are provided to generate the voice message. The output language can be configured as selectable and/or an output in several languages can be enabled. In addition, the voice message can be repeated after predefined intervals or can be temporarily or optionally switched-off. Voice messages for different detection means can be combined in a common voice message. In particular if the metal detector 5 is activated, a voice message containing the warning corresponding to the particular danger situation can be provided.

Figure 2:
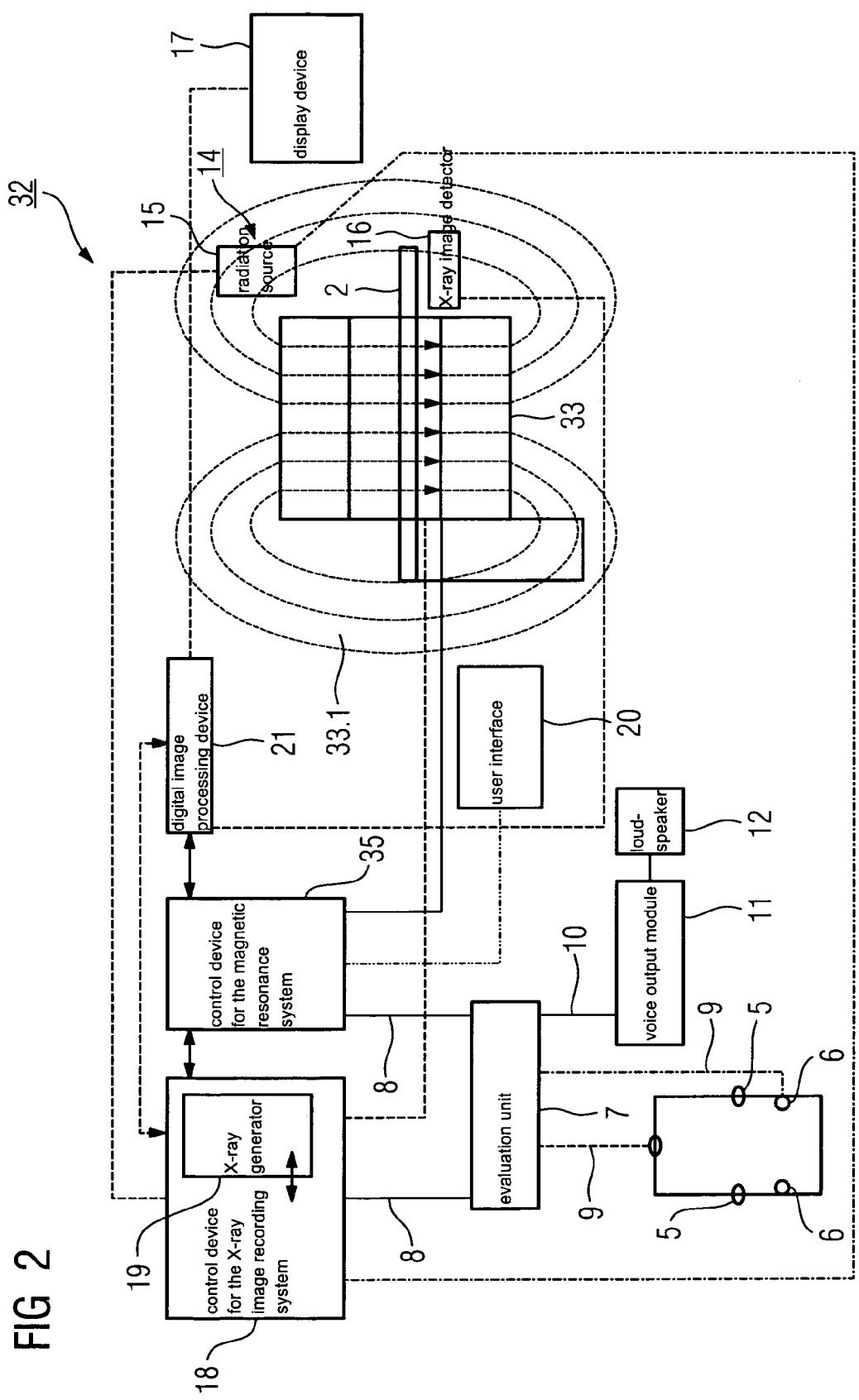
FIG. 2 shows a medical system for magnetic resonance tomography with an associated magnetic field of high field intensity and a subsystem for detecting access to this magnetic field.

In contrast to FIG. 1, FIG. 2 shows a magnetic resonance system 32 as the total medical system instead of a system for magnetic navigation, a magnetic resonance tomography system 32 for example. An element 33 generating a magnetic field generates a magnetic field 33.1 of high field intensity, the system thereby being controlled by means of a control unit 35. The precise mode of operation of the magnetic resonance system are not discussed here, since it is not relevant to the invention. It is disclosed for example in EP 1 340 994 A1. The function of the subsystem 5 to 12 according to FIG. 2 is comparable to the subsystem 5 to 12 according to FIG. 1.

Figure 3:
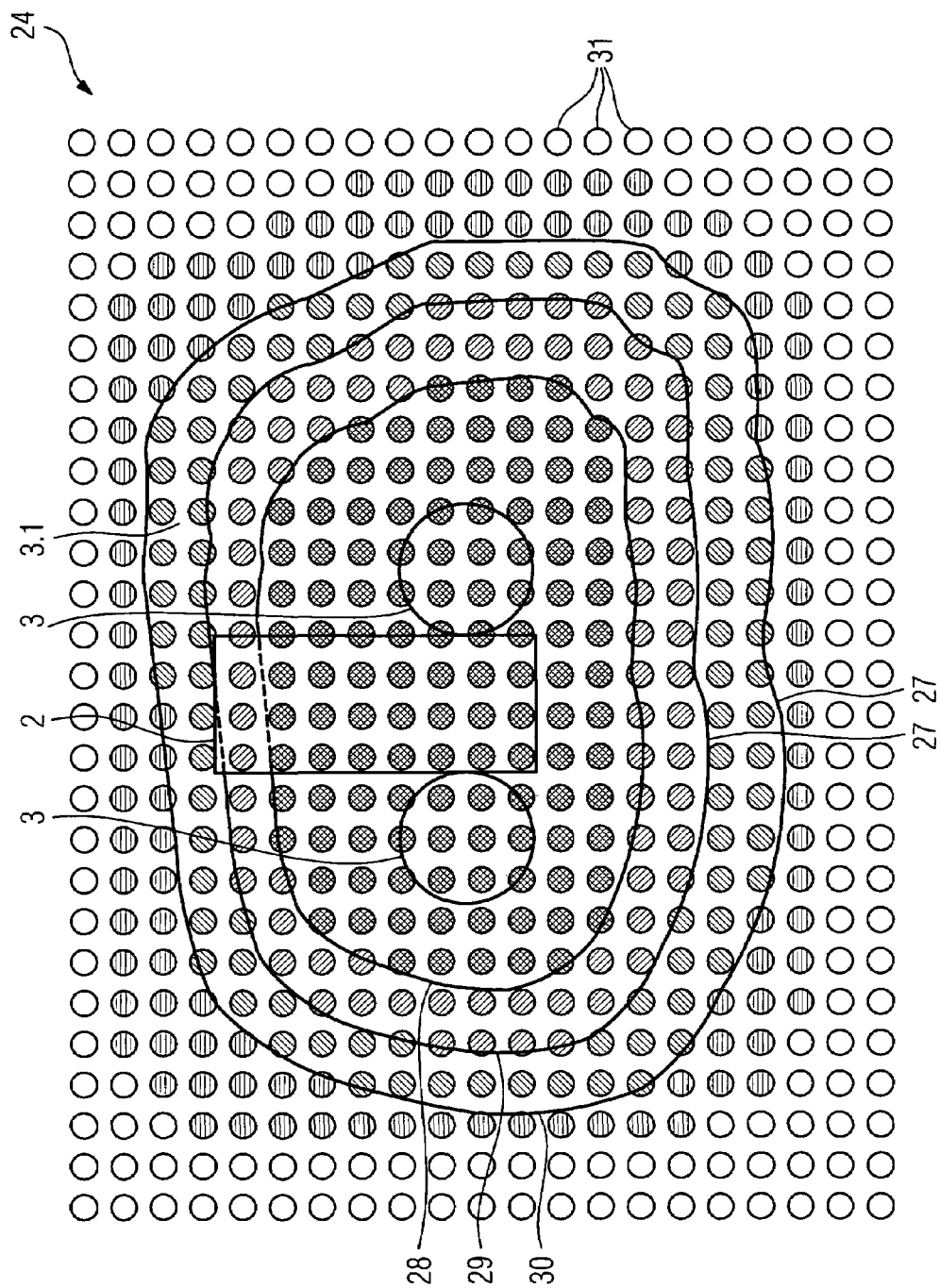
FIG. 3 shows an optical display of danger areas in the form of a luminescent display field located in the floor, and reproducing the field of high magnetic field intensity, made from light-emitting diodes.

FIG. 3 shows a means for generating an optical signal in the form of a luminescent display field 24 graphically reproducing the field of high magnetic field intensity 3.1 The field of high magnetic field intensity 3.1, in the area of which the patient support 2 for examining/treating a patient is located, is generated by a device 3 generating a magnetic field. For reasons of clarity in FIG. 3, the luminescent display field 24 is displayed such that it is completely visible despite the patient support 2 blocking the direct visual field and the device 3 generating the magnetic field. In an advantageous way that particularly clarifies the danger, the means for generating an optical signal is a luminescent display field 24 located in the floor, in particular embedded in the floor. The luminescent display field 24 can also be located on the ceiling or the walls. Activation of the luminescent display field 24, which advantageously reproduces the field line pattern 27 and/or the field intensity of the magnetic field 3.1, takes place in the event access detection.

Representation of the luminescent display field 24 by means of light-emitting diodes 31 is particularly advantageous as a result of their long service life. The luminescent display field 24 can similarly be represented by bulbs or other illumination means. For particularly clear recognition, one embodiment of the invention provides for a representation of different field intensities by means of corresponding different markings, in particular different colors, of the luminescent display field 24, shown in FIG. 3 by means of different hatchings. The area within a first field line 28 of 1 mT can thus be shown in red, the area between the first and within a second field line 29 of 0.8 mT in orange, the area between the second and within a third field line 30 of 0.5 mT in yellow and the area of the magnetic field with an intensity below 0.5 mT in green.

Access detection can also be arranged in the floor together with the light-emitting diodes and can detect the position of the approaching person, in particular in the area of the previously described field lines which represent specific field intensities, by means of pressure sensors for example. In the case of position detection of this type, the voice message can output the intensity of the field of high magnetic field intensity at the current position of the person.

Figure 4:
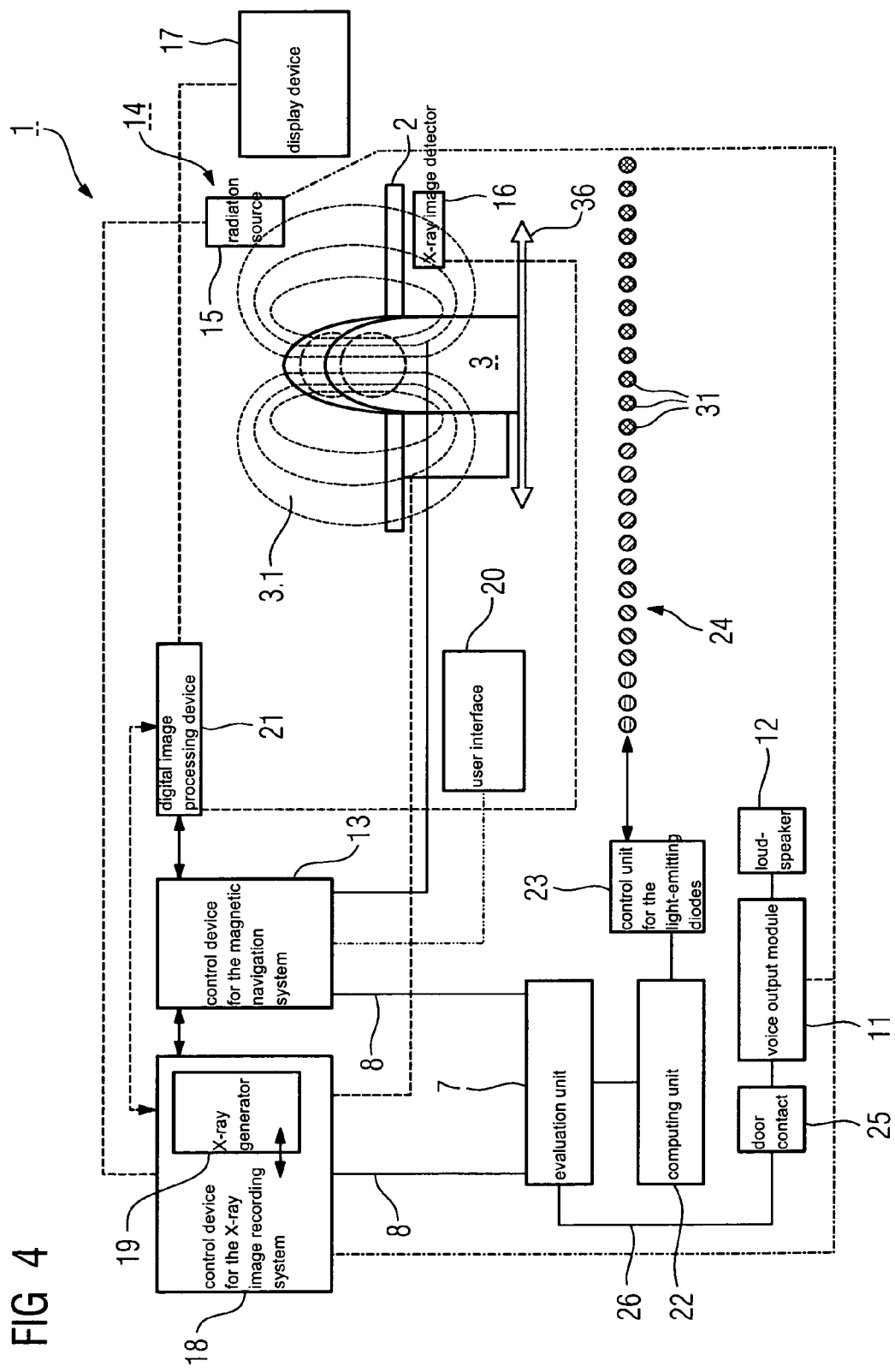
FIG. 4 shows a medical system for magnetic navigation with an associated magnetic field of high field intensity, a subsystem for detecting access and an optical display of danger areas according to FIG. 3.

FIG. 4 shows a total medical system 1 for magnetic navigation using an associated magnetic field of high field intensity 3. 1, a subsystem 7; 8; 11; 12; 22-26 for detecting access, and an optical luminescent display field 24 for displaying danger areas according to FIG. 3. Components that are the same as in FIG. 1 have the same reference characters in FIG. 4 and are not mentioned again in relation to FIG. 4, in order to avoid repetition. A door contact 25 is expediently provided as the means for detecting access. The total system 1 and the subsystem 7; 8; 11; 12; 22-26 are advantageously arranged in a room (not shown in further detail). Activation of the voice output module 11 and the loudspeaker 12 can take place in the event of access detection, as a result of which an automatic voice message is triggered to warn the incoming person.

Furthermore a connection between the door contact 25 and an evaluation unit 7 is provided by means of a communication line 26. The evaluation unit 7 is, as explained already with reference to FIG. 1, connected to the control unit 18 of the X-ray image recording system and 13 the magnetic navigation by means of communication lines 8 such that, in the case of access detection an operating block on at least one part of the total system is possible. A control unit 23 is provided to control the light-emitting diode 24, said control unit 23 being connected to the evaluation unit 7 by means of a computing unit 22. During operation of the total system, position data and field intensity data of the magnetic field 3.1 of high field intensity of the total system 1 and the elements 15; 16; 3, arranged in a movable fashion, of the X-ray image recording system and the magnetic navigation are transmitted to the computing unit 22 and compared there with data which is stored in a storage unit (not shown). The evaluation results are transmitted to the control unit 23 and used to control the luminescent display field 24 made of light-emitting diodes.

According to a further embodiment of the invention, a RFID Reader is provided as the means for detecting access. The abbreviation (=Radio Frequency Identification) refers to a method for the contactless reading and storage of data by means of radio waves without visual contact. With low frequencies this takes place inductively by means of a near field, and with higher frequencies by means of an electromagnetic remote field. If objects such as implants or people are equipped with a so-called RFID label containing corresponding information such as 'metallic' for example, the RFID reader in the entry area can automatically read out the information and take corresponding steps for access control as already described for the metal detector 5 and the light barrier 6. The RFID reader can also be provided as a supplement to the metal detector 5, in that all metal objects which carry an RFID label with the information "belonging to the system", are permitted. Provision can furthermore be made for the total system 1; 32 with a field 3.1; 33.1 of high magnetic field intensity only to be operated when objects with an RFID label, which were permitted in the area of the magnetic field for example for repair purposes, are removed again from the area during start-up.

The invention can be summarized in brief as follows, to increase safety during access to a total medical system 1, 32, in particular a medical system with a field 3.1; 33.1 of high magnetic field intensity, a subsystem 5-12; 22-26 is provided as means for detecting access, in particular with a light barrier 6 and/or a metal detector 5 and/or a door contact 25. According to one embodiment of the invention, the field line pattern and/or the intensity of the magnetic field is graphically represented by means of a luminescent display field 24 located on the floor, in particular made from light-emitting diodes 31.

The invention claimed is:

1. A medical system, comprising:
   a magnetic field having a high magnetic field intensity;
   an area within the medical system having the high magnetic field intensity;
   a subsystem for detecting an access to the area; and
   a signaling device for generating an acoustic or optical signal when the access is detected,
   wherein the signaling device generates an optical signal using a luminescent display array graphically representing the magnetic field, and
   wherein the luminescent display array is arranged on or embedded in a floor.

2. The medical system according to claim 1, wherein the medical system includes a magnetic resonance device.

3. The medical system according to claim 1, wherein the medical system includes a device utilizing magnetic navigation.

4. The medical system according to claim 1, further comprising a light barrier for detecting the access to the area.

5. The medical system according to claim 1, further comprising a metal detector for detecting the access to the area.

6. The medical system according to claim 1, further comprising a door contact for detecting the access to the area.

7. The medical system according to claim 1, further comprising an RFID reader for detecting the access to the area.

8. The medical system according to claim 1, further comprising a first blocking device for denying the access when the access to the area is detected.

9. The medical system according to claim 1, further comprising a second blocking device for disabling at least one functional unit of the medical system when the access to the area is detected.

10. The medical system according to claim 9, wherein the second blocking device is activated by a metal detector.

11. The medical system according to claim 8, further comprising a blocking release device for restoring the access to the area, wherein the access is restored after acknowledging the detected access.

12. The medical system according to claim 9, further comprising a blocking release device for restoring the access to the area, wherein the access is restored after acknowledging the detected access.

13. The medical system according to claim 11, further comprising a shut down device for de-energizing the magnetic field if the detected access is not acknowledged.

14. The medical system according to claim 1, wherein the signaling device generates a voice message.

15. The medical system according to claim 1, wherein the luminescent display array represents a field line pattern or a field intensity of the magnetic field.

16. The medical system according to claim 1, wherein the luminescent display array includes light-emitting diodes.

17. The medical system according to claim 1, wherein different field intensities of the magnetic field are represented on the luminescent display array using different markings.

18. The medical system according to claim 17, wherein the different markings are different colors.

* * * * *